United States Patent
Mostapha et al.

(10) Patent No.: US 12,374,004 B2
(45) Date of Patent: Jul. 29, 2025

(54) ACCELERATED MEDICAL IMAGE RECONSTRUCTION WITH IMPROVED ALIASING ARTIFACT REDUCTION

(71) Applicant: Siemens Healthineers AG, Forchheim (DE)

(72) Inventors: Mahmoud Mostapha, Princeton, NJ (US); Gregor Körzdörfer, Erlangen (DE); Marcel Dominik Nickel, Herzogenaurach (DE); Esther Raithel, Dormitz (DE); Simon Arberet, Princeton, NJ (US); Mariappan S. Nadar, Plainsboro, NJ (US)

(73) Assignee: Siemens Healthineers AG, Forchheim (DE)

( * ) Notice: Subject to any disclaimer, the term of this patent is extended or adjusted under 35 U.S.C. 154(b) by 414 days.

(21) Appl. No.: 17/811,889

(22) Filed: Jul. 12, 2022

(65) Prior Publication Data

US 2024/0020889 A1    Jan. 18, 2024

(51) Int. Cl.
*G06T 11/00*    (2006.01)
*G06T 7/00*    (2017.01)

(52) U.S. Cl.
CPC .......... *G06T 11/006* (2013.01); *G06T 7/0012* (2013.01); *G06T 2207/10088* (2013.01); *G06T 2207/20084* (2013.01); *G06T 2211/424* (2013.01); *G06T 2211/441* (2023.08)

(58) Field of Classification Search
CPC .............. G06T 11/006; G06T 7/0012; G06T 2207/10088; G06T 2207/20084; G06T 2211/424; G06T 2211/441
See application file for complete search history.

(56) References Cited

U.S. PATENT DOCUMENTS

| | | | | |
|---|---|---|---|---|
| 2014/0247046 | A1* | 9/2014 | Grinstead | G01R 33/50 324/309 |
| 2019/0172230 | A1* | 6/2019 | Mailhe | G06T 5/20 |
| 2020/0096587 | A1* | 3/2020 | Huang | G01R 33/5608 |

(Continued)

FOREIGN PATENT DOCUMENTS

| | | | | | |
|---|---|---|---|---|---|
| CN | 103293499 | A | * | 9/2013 | G01R 33/56 |
| CN | 113129296 | A | * | 7/2021 | G06F 18/214 |

(Continued)

OTHER PUBLICATIONS

Hussain et al., "Depth-Wise Pooling: A Parameter-Less Solution for Channel Reduction of Feature-Map in Convolutional Neural Network", Aug. 2019, Proceedings of the 2019 IEEE International Conference on Real-time Computing and Robotics (Year: 2019).*

(Continued)

*Primary Examiner* — SJ Park
*Assistant Examiner* — Caroline E. Depalma

(57) ABSTRACT

For reconstruction in medical imaging, such as reconstruction in MR imaging, scanning is accelerated by undersampling. In iterative reconstruction, the input to the regularizer is altered provide for correlation of non-local aliasing artifacts. Duplicates of the input image are shifted by different amounts based on the level of acceleration. The resulting shifted images are used to form the input to the regularizer. Providing an input based on shifts allows the regularization to suppress non-local as well as local aliasing artifacts.

21 Claims, 5 Drawing Sheets

(56) References Cited

U.S. PATENT DOCUMENTS

2022/0051454 A1    2/2022  Nickel et al.
2022/0165002 A1    5/2022  Mostapha et al.

FOREIGN PATENT DOCUMENTS

| EP | 2100157 A2 | * | 9/2009 | ............ G01R 33/28 |
| JP | H119589 A | * | 1/1999 | ............... A61B 6/03 |
| JP | H11267117 A | * | 10/1999 | ............... A61B 6/03 |
| WO | WO-2021259828 A1 | * | 12/2021 | ........... G01R 33/482 |

OTHER PUBLICATIONS

Knoll et al., "Deep-Learning Methods for Parallel Magnetic Resonance Image Reconstruction: A Survey of the Current Approaches, Trends, and Issues", Jan. 2020, IEEE Signal Processing Magazine (Year: 2020).*
Lin et al., "Optical Fringe Patterns Filtering Based on Multi-stage Convolution Neural Network", Jul. 2020, arXiv (Year: 2020).*
U.S. Appl. No. 17/473,206, filed Sep. 13, 2021.
U.S. Appl. No. 17/577,148, filed Jan. 17, 2022.

* cited by examiner

ACCELERATED MEDICAL IMAGE RECONSTRUCTION WITH IMPROVED ALIASING ARTIFACT REDUCTION

FIELD

This disclosure relates to medical image reconstruction, such as reconstruction in magnetic resonance (MR) imaging.

BACKGROUND

Medical imaging, such as magnetic resonance (MR), computed tomography (CT), positron emission tomography (PET), or single photon emission computed tomography (SPECT), use reconstruction to estimate an image or real-space object from measurements. These scans may be time consuming. For example, numerous methods have been proposed to accelerate the MR scan. One acceleration method is the under-sampling reconstruction technique (e.g., MR parallel imaging (PI) with compressed sensing (CS)), where fewer samples are acquired in the MRI data space (k-space), and prior knowledge is used to restore the images in reconstruction. Various acceleration factors, R, may be used, where greater R results in fewer samples.

Current accelerated MRI reconstruction is formulated as a trainable unrolled optimization framework with several cascades of regularization networks and varying data consistency layers. Regularization models based on convolutional neural networks (CNNs) suppress aliasing artifacts caused by PI. However, CNNs with practical capacity have limited receptive field of view (FOV) and assume the locality of pixel dependencies. Such limitations make standard CNNs inefficient in processing accelerated MR reconstructions with aliasing artifacts with non-local correlations. For an under-sampled image (acceleration factor R), the energy required to reconstruct a pixel is located at 1/R of FOV, 2/R of FOV, . . . .

The baseline approach is to improve CNNs receptive FOV by using deeper architectures with increased capacity. However, the increased computational cost limits their usage in practical settings. Vision transformers that impose fewer locality assumptions, leading to better performance with non-local pixel correlations, may be used. However, such models require extensive data to learn everything from scratch, which is typically not feasible with limited medical imaging datasets.

SUMMARY

By way of introduction, the preferred embodiments described below include methods, systems, instructions, and computer readable media for reconstruction in medical imaging, such as reconstruction in MR imaging. Scanning is accelerated by under-sampling. In iterative reconstruction, the input to the regularizer is altered to provide for correlation of non-local aliasing artifacts. Duplicates of the input image are shifted by different amounts based on the level of acceleration. The resulting shifted images are used to form the input to the regularizer. Providing an input based on shifts allows the regularization to suppress non-local as well as local aliasing artifacts.

In a first aspect, a method is provided for reconstruction of a medical image in a medical imaging system. The medical imaging system scans a patient with an acceleration factor, the scanning resulting in measurements. An image processor reconstructs the medical image from the measurements. The reconstruction includes a regularizer implemented with a machine-learned network. An input to the regularizer is a function of a number of first images where the number corresponds to the acceleration factor. The first images are shifted relative to each other. The medical image is displayed.

In one embodiment, the medical imaging system is a magnetic resonance (MR) scanner. The measurements are k-space measurements. The scanning is parallel imaging combined with compressed sensing.

In another embodiment, the reconstructing includes reconstructing as an unrolled iterative reconstruction where each of multiple reconstructions in the unrolled iterative reconstruction includes regularization. The regularizer provides the regularization for at least one of the multiple reconstructions. In one example, the input is generated as an initialization of the unrolled iterative reconstruction. The regularizer is a first of the multiple reconstructions.

According to another embodiment, reconstructing includes forming the first images as a circular shift from an output image of a data-consistency check.

In an embodiment, reconstructing includes forming the first images where the number substantially equals the acceleration factor. In one example, forming the first images includes shifting a baseline image by different shifts. Each of the shifts is a function of the acceleration factor where the number of first images is provided as the baseline image and shifted images corresponding to the different shifts. As another example, forming the first images includes shifting a baseline image by different shifts. The different shifts are fractions with the acceleration factor as a denominator, such as shifting with sequential integers as numerators of the fractions or shifting with a field of view of the regularizer multiplied by sequential integers as numerators of the fractions.

As another embodiment, reconstructing includes inputting a concatenation of the first images as the input to the regularizer.

In yet another embodiment, reconstructing further includes applying convolutional neural networks to the first images, respectively. The input to the regularizer is a normalization of the first images output by the convolutional neural networks such as a sum and convolution. In a further example, applying the convolutional neural networks includes applying, independently for each of the first images, the convolutional neural networks with shared weights.

As an embodiment, a maximum number of channels is provided. Reconstructing includes forming the first images where the number is less than the maximum number. Zero padding is used for excess ones of the channels.

In a second aspect, a system is provided for reconstruction in medical imaging. A medical scanner is configured to scan a region of a patient. The scan under samples by a factor and provides scan data. An image processor is configured to reconstruct a representation of the region from the scan data. The image processor is configured to reconstruct by application of a machine-learned model in a regularization stage. The regularization stage has an input that is a function of relatively shifted copies of an input image. The relatively shifted copies have shifts based on the factor. A display is configured to display an image of the region from the reconstructed representation.

According to one embodiment, the image processor is configured to reconstruct with an unrolled iterative reconstruction. The input to the regularization stage is an initialization of the unrolled iterative reconstruction.

In another embodiment, the image processor is configured to form the relatively shifted copies as circular shifts by different amounts. The different amounts being different fractions with the factor in the denominator.

As another embodiment, the machine-learned model of the regularization stage includes a convolutional neural network arranged to receive the input. The input is a concatenation of the relatively shifted copies.

As one embodiment, the machine-learned model of the regularization stage includes convolutional neural networks with shared weights independently applied to the relatively shifted copies and a sum and convolution network combining outputs of the convolutional neural networks.

As a third aspect, a method is provided for reconstruction of a medical image. A magnetic resonance imaging system scans a patient using parallel imaging with compressed sensing having an acceleration factor. The scanning results in k-space data. An image processor reconstructs the medical image from the measurements. The reconstruction includes a data consistency stage and a regularization stage. An output of the data consistency stage is circularly shifted different amounts to form different shifted images. The different amounts are based on the acceleration factor. An input to the regularization stage is based on the shifted images. The medical image is displayed.

The present invention is defined by the following claims, and nothing in this section should be taken as a limitation on those claims. Further aspects and advantages of the invention are discussed below in conjunction with the preferred embodiments and may be later claimed independently or in combination.

DETAILED DESCRIPTION

The regularization in reconstruction, such as implemented by CNNs, is extended by incorporating information about the periodicity of PI aliasing artifacts. To improve CNNs' ability to suppress non-local aliasing artifacts, a de-aliasing CNN architecture is introduced to allow for non-local pixel dependencies in a way that takes into account the prior knowledge of the expected locations of the aliased replicas given an acceleration factor R. The de-aliasing may result in better reconstructions, such as when used in an unrolled optimization framework. Flexible design of de-aliasing blocks allows for training and/or deployment of deep-learned reconstruction frameworks with variable acceleration factors associated with a targeted application.

Figure 1:
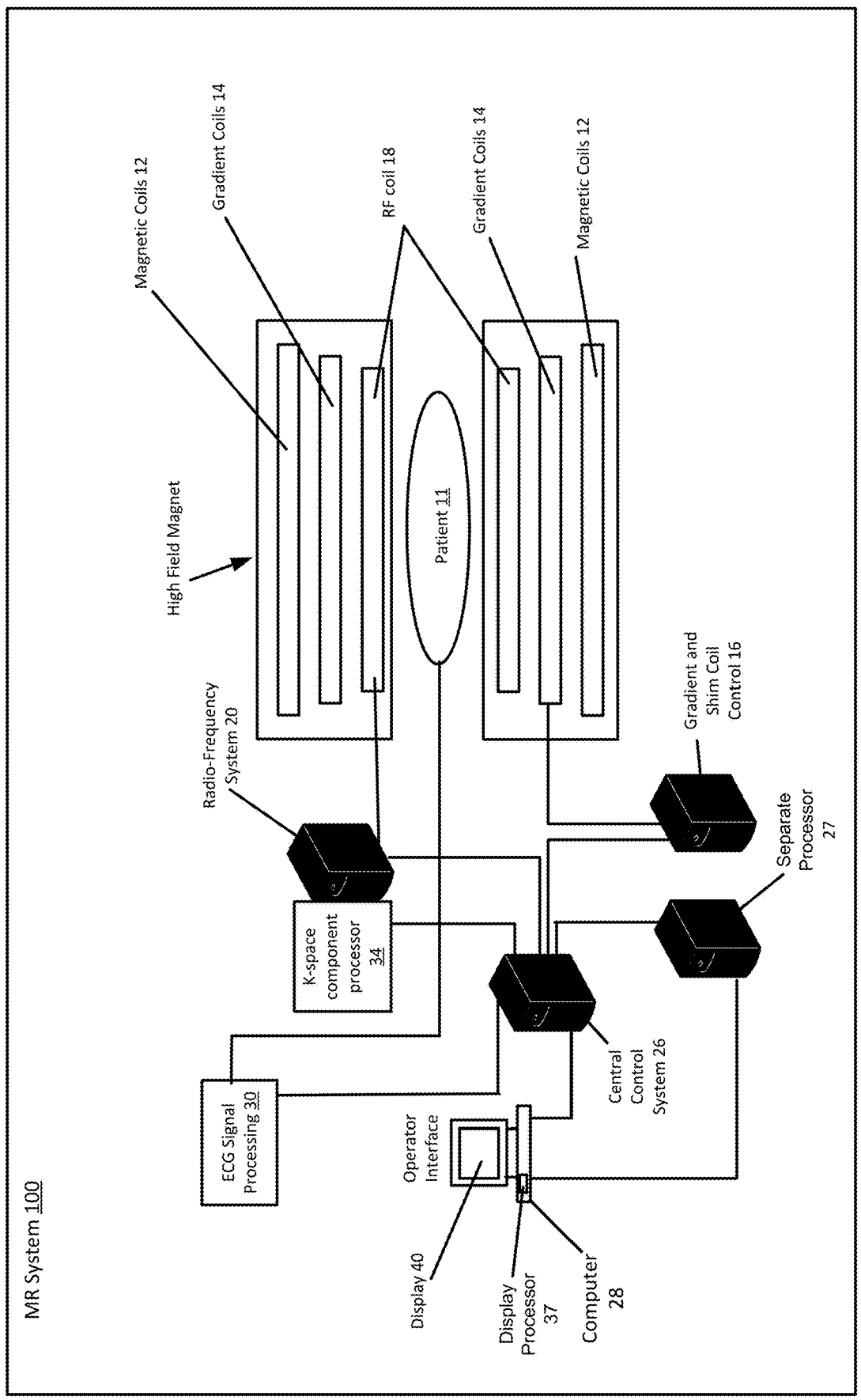
FIG. 1 is a block diagram of an embodiment of an MR system for medical imaging with improved aliasing artifact reduction.

FIG. 1 shows one embodiment of a system for reconstruction in medical imaging. The input for image regularization is based on relative shifts or other alteration that are a function of the acceleration used in scanning.

The example used herein is in a magnetic resonance context (i.e., a magnetic resonance scanner), but the regularizer may be used in reconstruction for CT, PET, SPECT, or other medical imaging. The regularizer is used for reconstruction into an object or image domain from projections or measurements in another domain. In the discussion below, the MR context is used.

The system uses a machine-learned model in reconstruction. The machine-learned model is formed from one or more networks and/or another machine-learned architecture. For example, the machine-learned model is a deep learned neural network, such as a convolutional neural network. The machine-learned model is used for regularization of reconstruction. Image or object domain data is input, and image or object domain data with less artifact is output. The machine-learned model assists in compressed, parallel sensing, or other MR imaging for more rapid scanning with less computational burden in reconstruction. The remaining portions or stages of the reconstruction (e.g., Fourier transform and gradients in iterative optimization) are performed using reconstruction algorithms and/or other machine-learned networks.

The system is implemented by an MR scanner or system, a computer based on data obtained by MR scanning, a server, or another processor. MR scanning system 100 is only exemplary, and a variety of MR scanning systems can be used to collect the MR data. In the embodiment of FIG. 1, the system is or includes the MR scanner or MR system 100. The MR scanner 100 is configured to scan a patient. The scan provides scan data in a scan domain. The system 100 scans a patient to provide k-space measurements (measurements in the frequency domain). In the MR system 100, magnetic coils 12 create a static base magnetic field in the body of patient 11 to be positioned on a table and imaged. Within the magnet system are gradient coils 14 for producing position dependent magnetic field gradients superimposed on the static magnetic field. Gradient coils 14, in response to gradient signals supplied thereto by a gradient and shim coil control module 16, produce position dependent and shimmed magnetic field gradients in three orthogonal directions and generate magnetic field pulse sequences. The shimmed gradients compensate for inhomogeneity and variability in an MR imaging device magnetic field resulting from patient anatomical variation and other sources. The magnetic field gradients include a slice-selection gradient magnetic field, a phase-encoding gradient magnetic field, and a readout gradient magnetic field that are applied to patient 11.

RF (radio frequency) module 20 provides RF pulse signals to RF coil 18, which in response produces magnetic field pulses that rotate the spins of the protons in the imaged body of the patient 11 by ninety degrees, by one hundred and eighty degrees for so-called "spin echo" imaging, or by angles less than or equal to 90 degrees for so-called "gradient echo" imaging. Gradient and shim coil control module 16 in conjunction with RF module 20, as directed by central controller 26, control slice-selection, phase-encoding, readout gradient magnetic fields, radio frequency transmission, and magnetic resonance signal detection, to acquire magnetic resonance signals representing planar slices of patient 11.

In response to applied RF pulse signals, the RF coil 18 receives MR signals, i.e., signals from the excited protons within the body as they return to an equilibrium position established by the static and gradient magnetic fields. The MR signals are detected and processed by a detector within RF module 20 and k-space component processor unit 34 to provide an MR dataset to an image data processor for processing into an image (i.e., for reconstruction in the object domain from the k-space data in the scan domain). In some embodiments, the image processor is located in or is the central controller 26. In other embodiments, such as the one depicted in FIG. 1, the image processor is located in a separate processor 27. ECG synchronization signal generator 30 provides ECG signals used for pulse sequence and imaging synchronization. A two- or three-dimensional k-space storage array of individual data elements in k-space component processor 34 stores corresponding individual frequency components forming an MR dataset. The k-space array of individual data elements has a designated center, and individual data elements individually have a radius to the designated center.

A magnetic field generator (comprising coils 12, 14 and 18) generates a magnetic field for use in acquiring multiple individual frequency components corresponding to individual data elements in the storage array. The individual frequency components are successively acquired. A storage processor in the k-space component processor 34 stores individual frequency components. The central control processor 26 is programmed to sample the MR signals according to a predetermined sampling pattern. Any MR scan sequence may be used, such as for T1, T2, or other MR parameter.

In one embodiment, a compressive sensing scan sequence is used. Parallel imaging with or without compressive sensing may be used. Other accelerated scans that under sample may be used. To speed scanning, under-sampling is used. The amount of under sampling is represented by an acceleration factor, R. The acceleration factor may be any real number. In one embodiment, the acceleration factor is an integer, such as a multiple of two. Different scans may use different acceleration factors.

The central controller 26 also uses information stored in an internal database to process the detected MR signals in a coordinated manner to generate high quality images of a selected slice(s) of the body (e.g., using the image processor) and adjusts other parameters of system 100. The stored information includes a predetermined pulse sequence and a magnetic field gradient and strength data as well as data indicating timing, orientation and spatial volume of gradient magnetic fields to be applied in imaging.

The central controller 26 (i.e., controller) and/or processor 27 is an image processor that reconstructs a representation of the patient from the k-space data. The image processor is a general processor, digital signal processor, three-dimensional data processor, graphics processing unit, application specific integrated circuit, field programmable gate array, artificial intelligence processor, tensor processor, digital circuit, analog circuit, combinations thereof, or another now known or later developed device for reconstruction. The image processor is a single device, a plurality of devices, or a network. For more than one device, parallel or sequential division of processing may be used. Different devices making up the image processor may perform different functions, such as reconstructing by one device and volume rendering by another device. In one embodiment, the image processor is a control processor or other processor of the MR scanner 100. Other image processors of the MR scanner 100 or external to the MR scanner 100 may be used (e.g., a workstation or computer separate from the MR scanner 100).

The image processor is configured by software, firmware, or hardware to reconstruct. The image processor operates pursuant to stored instructions on a non-transitory medium to perform various acts described herein.

The image processor is configured to reconstruct a representation in an object domain. The object domain is an image space and corresponds to the spatial distribution of the patient. A planar area or volume representation is reconstructed as an image representing the patient. For example, pixels values representing tissue in an area or voxel values representing tissue distributed in a volume are generated. The pixel values may have a complex (e.g., real and imaginary) representation. In-phase and quadrature or radio frequency representation may be used.

The representation in the object domain is reconstructed from the scan data in the scan domain. The scan data is a set or frame of k-space data from a scan of the patient. The k-space measurements resulting from the scan sequence are transformed from the frequency domain to the spatial domain in reconstruction. In general, reconstruction is an iterative process, such as a minimization problem. This minimization can be expressed as:

$$x = \underset{x}{\operatorname{argmin}} \|Ax - y\|_2^2 + \lambda \|Tx\|_1 \quad (1)$$

where x is the target image to be reconstructed, and y is the raw k-space data. A is the MRI model to connect the image to MRI-space (k-space), which can involve a combination of an under-sampling matrix U, a Fourier transform F, and sensitivity maps S. T represents a sparsifying (shrinkage) transform. λ is a regularization parameter. The first term of the right side of equation 1 represents the image (2D or 3D spatial distribution or representation) fit to the acquired data, and the second term of the right side is a term added for denoising by reduction of artifacts (e.g., aliasing) due to under sampling. The l1 norm is used to enforce sparsity in the transform domain. $\|Ax-Y\|_2^2$ is the l2 norm of the variation of the under-sampled k-space data. Generally, the lp norm is $$\sqrt[p]{\sum |x|^p}.$$

In some embodiments, the operator T is a wavelet transform. In other embodiments, the operator T is a finite difference operator in the case of Total Variation regularization.

Figure 2:
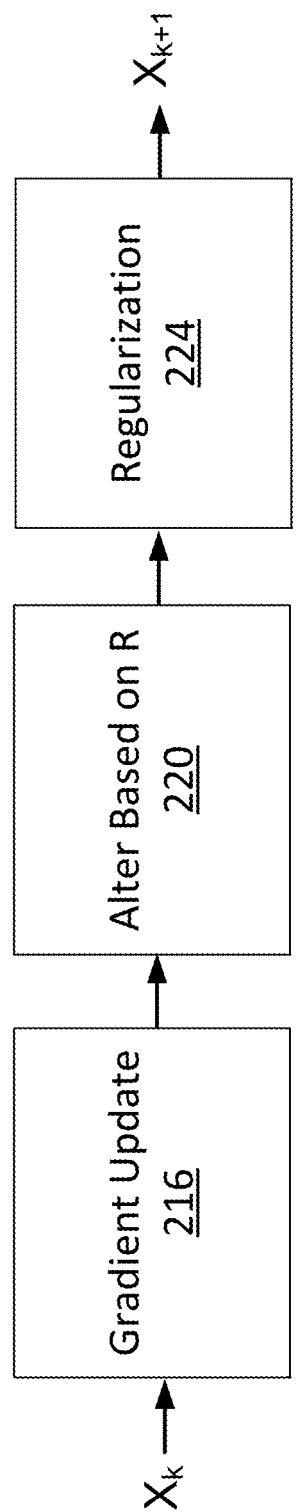
FIG. 2 shows an embodiment of iteration in reconstruction.

The reconstruction is iterative, such as repeating the reconstruction operation to minimize. In some embodiments, an unrolled iterative reconstruction is provided as a network or model of iteration sequences. As shown in FIG. 2, a given iteration either in an unrolled network or through a repetition of the reconstruction operations includes a gradient update 216 (e.g., first term of equation 1) and regularization 224 (e.g., second term of equation 1). The gradient update 216 compares the current image object with the scan data (e.g., k-space measurements, y) as a data consistency stage. This comparison uses a system transform to relate the measurements to the image object. Any gradient or comparison relating the image object to the measurements may be used. As shown in FIGS. 2, the regularization 224 operates on the output of the gradient update 216. The regularizer is, at least in part, a machine-learned network. A machine-learned model is applied in the regularization stage. In one embodiment, deep learning is used to train a convolutional neural network (CNN) as the regularizer.

Regularization may not be included in all the iterations. Input bias field correction and/or extrapolation for momentum may be provided as part of the reconstruction. Other filtering and/or operations for reconstruction and/or post-reconstruction may be provided.

In one embodiment, the regularizer 224 is implemented as a machine-learned model, such as a machine-learned network. Machine learning is an offline training phase where the goal is to identify an optimal set of values of learnable parameters of the model that can be applied to many different inputs (i.e., image domain data after gradient calculation in the optimization or minimization of the reconstruction). These machine-learned parameters can subsequently be used during clinical operation to rapidly regularize the reconstruction of images. Once learned, the machine-learned model is used in an online processing phase in which an image from the gradient update 216 is input and the regularized image for the patient is output based on the model values learned during the training phase.

During application to one or more different patients and corresponding different scan data, the same learned weights or values for the regularization 224 are used. The model and values for the learnable parameters are not changed from one patient to the next, at least over a given time (e.g., weeks, months, or years) or given number of uses (e.g., tens or hundreds). These fixed values and corresponding fixed model are applied sequentially and/or by different processors to scan data for different patients. The model may be updated, such as retrained, or replaced but does not learn new values as part of application for a given patient.

The model has an architecture. This structure defines the learnable variables and the relationships between the variables. In one embodiment for the regularization 224, a neural network is used, but other networks or machine learning models may be used. In one embodiment, a convolutional neural network (CNN) is used. Any number of layers and nodes within layers may be used. A DenseNet, U-Net, encoder-decoder, Deep Iterative Down-Up CNN, and/or another network may be used. Some of the network may include dense blocks (i.e., multiple layers in sequence outputting to the next layer as well as the final layer in the dense block). Any known or later developed neural network may be used.

The image processor is configured to reconstruct with the machine-learned model (e.g., CNN) trained as a regularizer in the reconstruction. The iterative reconstruction may be unrolled where a given number of iterations of gradient update 216 and regularization 224 is used. The same CNN is used for each iteration. Alternatively, a different CNN is provided for each iteration, whether a different architecture or same architecture but with different values for one or more of the learnable parameters of the CNN. Different CNNs are trained for different iterations in the reconstruction. Each CNN may have the same architecture, but each is separately learned so that different values of the learnable parameters may be provided for different iterations of the reconstruction.

In an alteration stage 220, the image processor is configured to alter the output of the gradient update stage 216 for aliasing artifact reduction. The alteration stage 220 changes the image to be input to the regularization stage 224 in a way to allow for suppression of non-local aliasing artifacts in regularization. For example, the image processor is configured to generate shifted copies of the output, which shifted copies are combined to provide the input to the regularization stage 224 and/or are separately input to the regularization stage 224. Circular or other shifting is used. The input to the regularization stage 224 is a function of relatively shifted copies of an input image (i.e., output of the gradient update stage 216).

In an unrolled iterative reconstruction, the alteration 220 may be provided with or without the gradient update stage 216 in an initialization. The original input for the first or initial iteration of the regularization stage 224 is created by the alteration stage 220. An image, such as generated by an initial gradient update stage 216, a basic or simple reconstruction, or estimated from the measurements, is input to the alteration stage 220. The alteration stage 220 performs the alteration, such as generating shifted copies of the input image. The shifted copies are then combined and/or input to the initial regularization stage. In an alternative, or additional, embodiment, the alteration stage 220 is provided at other iterations of the unrolled iterative reconstruction, such as for all iterations or for a sub-set (e.g., first 5-10 iterations) of the iterations.

The alteration by the alteration stage 220 is based on the acceleration factor (e.g., under-sampling ratio, increase in scan speed, or other scan characteristic for under sampling). For example, the image processor is configured to form the relatively shifted copies as circular shifts by different amounts. The different amounts are different fractions with the factor in the denominator. The fraction may be a sequence of R integers for the numerator (e.g., 1/R, 2/R, . . . R/R), where R/R is no shift. The fraction may include the field of view (FOV) of the regularization stage 224, such as FOV/R, 2FOV/R, . . . R·FOV/R). The FOV is given by the kernel size and/or depth (number of layers) of the CNN of the regularization stage 224. Other fractions based on the acceleration factor may be used. R copies, including or not including the original, are made. Where R is a real number, then R is rounded to the nearest integer or the real number is used. In other embodiments, R is used in a ratio to determine the number of copies, which controls the amount of change for each copy. For example, (R+4)/2 gives the number of copies (e.g., R=2, so the ratio is 3) with equal or systematically determined shifts (e.g., 360 degrees divided by 3 provides 120-degree shifts) between each copy based on the ratio. A distribution of varying shifts may be used, such as using more of the number of copies with smaller shifts relative to the input or baseline image than with larger shifts.

The image processor is configured to generate an input for the regularization stage 224 from the alteration stage 220. In one embodiment shown in FIG. 3, the alteration stage 220 includes circular shifting 300 R or R−1 times, creating R versions of the input image. A concatenation layer 310, such as a concatenation layer of a neural network, receives the shifted copies. The concatenation layer 310 may be an input layer of the regularizer, so is trained with the regularizer. Alternatively, the concatenation layer 310 is trained separately or independently from the machine-learned model of the regularization stage 224. The concatenation combines the various shifted copies, such as by filtering, convolution, or averaging, into an image for input to the regularization stage 224. In other embodiments, the concatenation stage is programmed or hand coded (e.g., not trained but instead a programmed mathematical operation).

Figure 4:
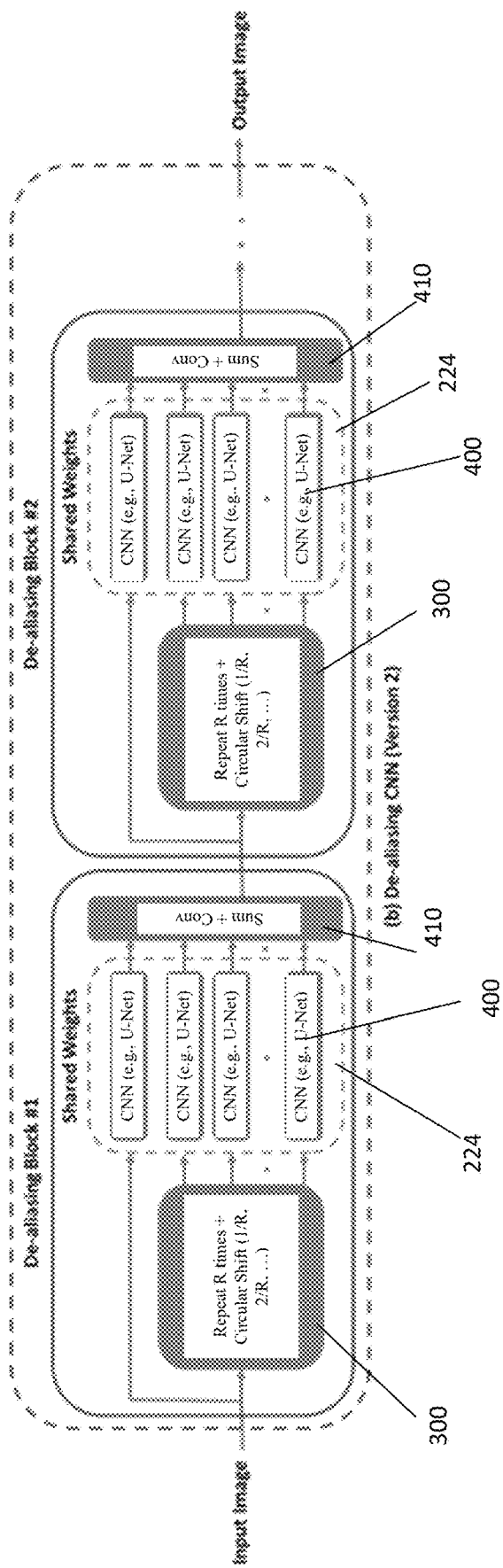
FIG. 4 is a block diagram of another embodiment of de-aliasing in regularization.

In another embodiment shown in FIG. 4, the regularization stage architecture is configured to separately receive the different shifted copies. For example, CNNs 400 for regularization are independently applied to the different or respective separate copies from the circular shifting 300. The CNNs 400 may be the same model, such as using shared weights. The outputs of the CNNs 400 of the regularizers are normalized, such as summed and convolved 410. The CNNs 400 may have been separately trained from the sum and convolution 410 or trained jointly with the sum and convolution 410. One, two, or more de-aliasing blocks (e.g., regularizers) may be provided in sequence for a given iteration.

After iterative reconstruction, the image processor outputs a complex image. The output image represents the patient (i.e., a reconstructed representation). The output complex image is the image generated for a given reconstruction iteration, such as a last iteration in an unrolled iterative reconstruction.

The image processor may be configured to generate an MR image from the reconstructed representation. Where the representation is of an area, the values of the representation may be mapped to display values (e.g., scalar values to display color values) and/or formatted for display (e.g., interpolated to a display pixel grid). Alternatively, the output representation is of display values in the display format. Where the representation is of a volume, the image processor performs volume or surface rendering to render a two-dimensional image from the voxels of the volume. This two-dimensional image may be mapped and/or formatted for display as an MR image. Any MR image generation may be used so that the image represents the measured MR response from the patient. The image represents a region of the patient.

Generated images of the reconstructed representation for a given patient are presented on a display 40 of the operator interface. The computer 28 of the operator interface includes a graphical user interface (GUI) enabling user interaction with central controller 26 and enables user modification of magnetic resonance imaging signals in substantially real time. The display processor 37 processes the magnetic resonance signals to provide image representative data for display on display 40, for example.

The display 40 is a CRT, LCD, plasma, projector, printer, or other display device. The display 40 is configured by loading an image to a display plane or buffer. The display 40 is configured to display the reconstructed MR image of a region of the patient.

Figure 5:
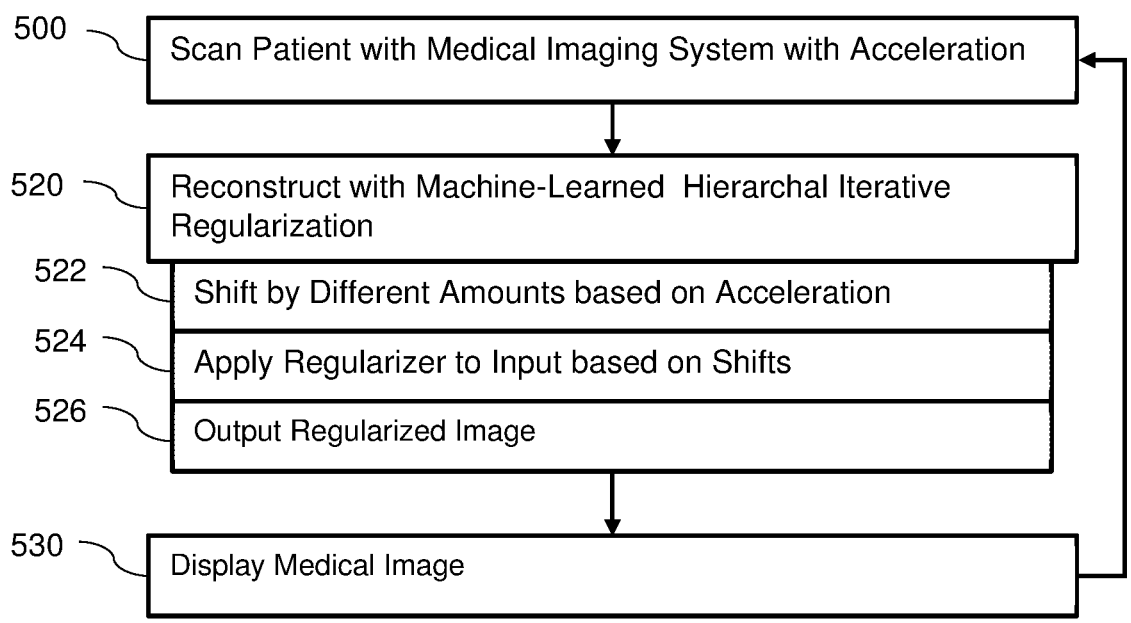
FIG. 5 is a flow chart diagram of one embodiment of a method for reconstruction using a machine-learned network for regularization with improved de-aliasing.

FIG. 5 is a flow chart diagram of one embodiment of a method for reconstruction of a medical image. The reconstruction is in a medical imaging system, such as reconstruction of a MR image by an MR system or reconstruction by a workstation, computer, or server that is part of an overall imaging system. The reconstruction includes regularization to reduce aliasing artifacts due to under sampling in the scan. To improve performance of the regularization, the input to the regularization is altered, such as creating copies with different shifts based on the acceleration of the scanning.

The scanning of act 500 may include different accelerations for different scans. The amount of acceleration or acceleration factor may be different for different times and/or patients. The alteration of the input for regularization is selected based on the acceleration factor. Alternatively, a same alteration that adapts to the acceleration factor is used.

The method is performed by the system of FIG. 1 or another system. The medical scanner scans the patient. An image processor reconstructs the image, and a display displays the medical image. Other components may be used, such as a remote server or a workstation performing the reconstruction and/or display.

The method is performed in the order shown or other orders. Additional, different, or fewer acts may be provided. For example, a preset, default, or user input settings are used to configure the scanning prior art act 500. As another example, the image is stored in a memory (e.g., computerized patient medical record) or transmitted over a computer network instead of or in addition to the display of act 530. In another example, one or more of acts 522, 524, and/or 526 are not performed as these acts represent one embodiment or example of performing act 520.

In act 500, the medical system scans a patient. For example, an MR scanner or another MR system scans the patient with an MR compressed (e.g., under sampling), parallel, compressed parallel (PI combined with compressed sensing), or another MR sequence. The amount of under sampling is based on the settings, such as the acceleration. An acceleration factor has a default value and/or may be set by the user, scan application, and/or another. Based on the configuration of the MR scanner, a pulse sequence is created. The pulse sequence is transmitted from coils into the patient. The resulting responses are measured by receiving radio frequency signals at the same or different coils. The scanning results in k-space measurements as the scan data. The acceleration speeds scanning.

In another example, a computed tomography scanner scans a patient by transmitting x-rays from different angles through the patient. The scanning results in detected projections for a given patent as the scan data.

In act 520, an image processor reconstructs a representation of the patient from the scan data. For MR reconstruction, the k-space data is Fourier transformed into scalar values representing different spatial locations, such as spatial locations representing a plane through or volume of a region in the patient. Scalar pixel or voxel values are reconstructed as the MR image. The spatial distribution of measurements in object or image space is formed. This spatial distribution represents the patient.

The reconstruction is performed, at least in part, using a deep machine-learned model, such as a neural network trained with deep machine learning, for regularization. The machine-learned model is previously trained, and then used in reconstruction as trained. Fixed values of learned parameters are used for application. In application of the already trained network, the reconstruction process is followed. The machine-learned model is used in the reconstruction. For example, regularization is performed in every or only some iterations using the deep learned network (e.g., CNN of FIGS. 3-4). In response to the input for a given patient, a patient specific image is reconstructed. The machine-learned model outputs the image as pixels, voxels, and/or a display formatted image in response to the input. The learned values and network architecture, with any algorithms (e.g., extrapolation and gradient update) determine the output from the input. In alternative embodiments, the regularization uses hand coding or programming without a machine-learned model.

Deep learning is used to train the regularization model. Many (e.g., hundreds or thousands) of samples of inputs to the model and/or the reconstruction and ground truth outputs are collected as training data. The training learns both the features of the input data and the conversion of those features to the desired output (i.e., denoised or regularized image domain data). Backpropagation, RMSprop, ADAM, or another optimization is used in learning the values of the learnable parameters of the regularization 224 (i.e., the CNN). Where the training is supervised, the differences (e.g., L1, L2, or mean square error) between the estimated output and the ground truth output are minimized. Where a discriminator is used in training, the ground truth is not needed. Instead, the discriminator determines whether the output is real or estimated as an objective function for feedback in the optimization. The characteristic is one that likely distinguishes between good and bad output by examining the output rather than by comparison to a known output for that sample. Joint training (e.g., semi-supervised) may be used.

Any architecture or layer structure for machine learning to regularize in reconstruction may be used. The architecture defines the structure, learnable parameters, and relationships between parameters. In one embodiment, a convolutional or another neural network is used for the regularizer. Deep machine training is performed. Any number of hidden layers may be provided between the input layer and output layer.

In one embodiment, the architecture includes a sequence of iterations or unrolled iteration networks. A neural network with an unrolled arrangement of U-blocks in a sequence is machine trained as a regularizer for the reconstruction in the medical imaging. The architecture may include U-blocks with down-sampling and up-sampling, such as implemented as a CNN, fully connected network, or another network arrangement. In additional or alternative embodiments, the architecture includes one or more hierarchal U-networks, such as one or more (e.g., each) of the U-blocks for iteration including hierarchal U-networks. The hierarchal U-networks have blocks at different scales with down and up-sampling, providing down and up-sampling in at least one block that is part of a down-sampling chain and/or providing down and up-sampling in at least one block that is part of an up-sampling chain. The iterative and/or hierarchal architecture is machine trained, such as machine training with each of the U-blocks in the sequence having a hierarchy of U-networks. The U-networks may have local and/or global residual connections for data consistency.

Once trained, the neural networks are applied in reconstruction of a representation or image of a patient from a scan of that patient. For example, the machine-learned networks for regularization are used with reconstruction algorithms (e.g., gradient descent and extrapolation) during unrolled iterative reconstruction.

In one embodiment, the unrolled reconstruction is used. The unrolled reconstruction includes a set number of iterations, but another optimization stop criterion may be used. Each iteration may be handled differently. For example, a separate neural network or machine-learned model is trained for each reconstruction iteration. The same or different architecture of the network is used for the different iterations. For example, different networks of the same architecture but with one or more different learned values of the learnable parameters are provided for different ones of the reconstruction iterations. In training, each network and weight or weights are trained simultaneously or together across iterations. By reconstructing as part of training, the simultaneous training for the different iterations is provided.

In another embodiment, the reconstruction or part of the reconstruction is an iterative optimization (i.e., not unrolled). The reconstruction includes an optimization. The machine-learned model (e.g., learned regularization network) is used within or as part of the reconstruction optimization, such as for denoising data.

After training, the machine-learned model or models are represented as a matrix, filter kernels, and/or architecture with the learned values. The learned convolution kernels, weights, connections, and/or layers of the neural network or networks are provided.

Once trained, the machine-learned model (e.g., learned CNN) is used for reconstruction of a spatial representation from input k-space measurements for a patient. For example, the machine-learned model is applied for regularization in the reconstruction. The machine-learned network of the machine-learned model implements a regularizer. The reconstruction is performed iteratively with gradients (data consistency stage), a Fourier transform, and the regularizer. The regularizer receives image space information from the Fourier transform or after the gradient operation and outputs denoised image space information.

The output of the machine-learned network is a two-dimensional distribution of pixels representing an area of the patient and/or a three-dimensional distribution of voxels representing a volume of the patient. The output from the last reconstruction iteration may be used as the output representation of the patient.

Other processing may be performed on the input k-space measurements before input. Other processing may be performed on the output representation or reconstruction, such as spatial filtering, color mapping, and/or display formatting. In one embodiment, the machine-learned network outputs voxels or scalar values for a volume spatial distribution as the medical image. Volume rendering is performed to generate a display image as a further display image. In alternative embodiments, the machine-learned network outputs the display image directly in response to the input.

Figure 3:
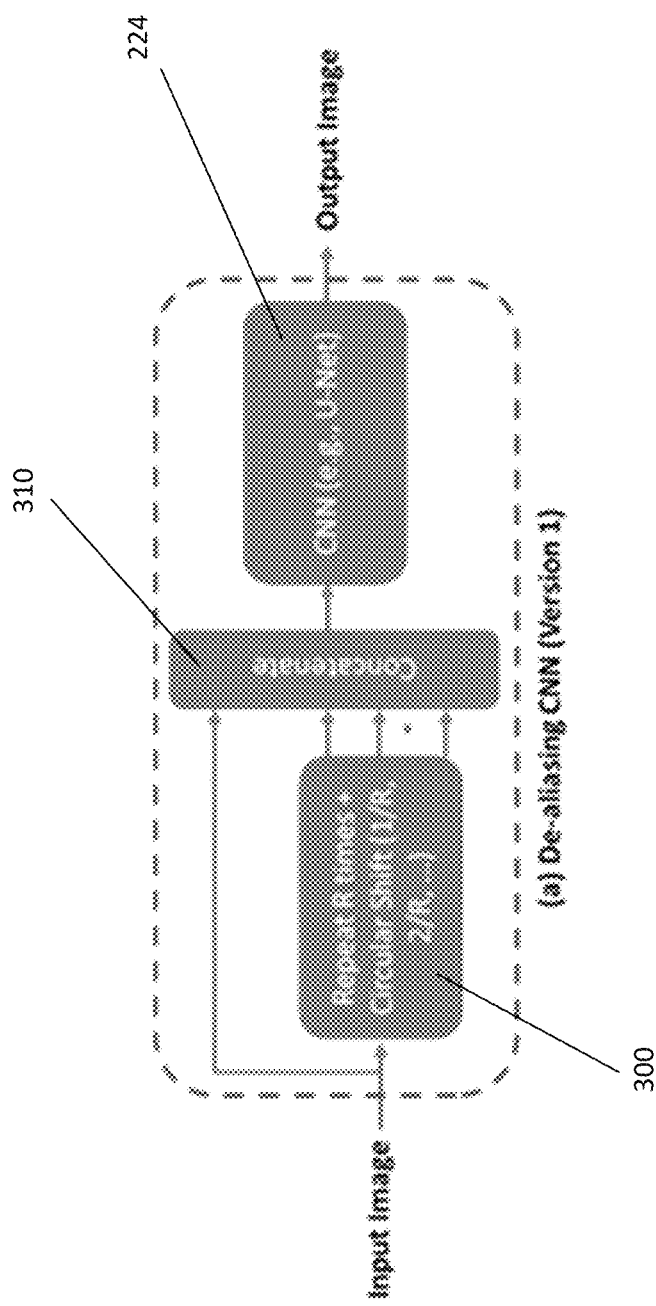
FIG. 3 is a block diagram of one embodiment of de-aliasing in regularization.

The input to the regularizer is a function of a number (plurality) of images. The image from the data consistency (gradient operation) is altered to create multiple images. The number of images corresponds to the acceleration factor, such as R images where R is the acceleration factor rounded to the nearest integer. Other relations for the acceleration factor to the number may be used, such as ½ or 2 times R for the number. The different images are formed by altering the baseline image (output of the gradient stage) by different amounts. For example, R images are formed by relative shifts in act 522. As shown in FIG. 3, one way to achieve that is to create (R−1) shifted versions of the input or baseline complex image by repeating of the input image channels (i.e., duplication) followed by applying a circular shift with FOV/R, (2*FOV)/R, . . . to the different duplicates (e.g., baseline image, image 2 is shifted by FOV/R, image 3 is shifted by (2*FOV)/R, image 4 shifted by (3*FOV)/R). The baseline image or duplicates of the baseline image are shifted by different amounts, creating the shifted copies. The shifted copies of the baseline image are concatenated on the channel dimension before using CNN regularization. Such a multichannel approach allows for directly exploiting correlations among differently shifted versions of the input image. Other shifts than circular and/or other alterations may be used.

The change (e.g., circular shift) is based on the acceleration factor. The number of copies and/or the amount of change is based on the acceleration factor. Any function may be used, such as the number substantially equals the acceleration factor. Substantially is used to account for rounding, such as rounding 2.5 to 3. As another example, the function is a fraction with the acceleration factor being the denominator or being part of the denominator, such as 1/R, 2/R, 3/R . . . R/R or FOV/R, 2FOV/R, 3FOV/R . . . RFOV/R for the shifts-providing the amount of shift. The resulting copies of the input image include the input image without alteration and the remainder of the number are images with alteration (e.g., shifts).

The input to the regularization stage is based on the shifted images. In act 524, the regularizer is applied to an input, which is based on the alteration (e.g., shifts). In the embodiment of FIG. 3, the input is a concatenation 310 of the altered images. The images are concatenated before applying the CNN-based regularization. In the embodiment of FIG. 4, the input to the regularization stage is the altered images. The different altered images are independently regularized with CNNs 400 using shared weights and the same architecture (i.e., the same or copies of the same machine-learned model). The combination occurs as part of regularization, such as summing and convoluting the sum 410 as part of a machine-learned model. Other combinations for input may be used, such as concatenating into a lesser number of images and independently regularizing the resulting concatenated images.

The same network (alteration stage) may be used for different accelerations. Where the alteration stage is hand coded or a mathematical operation, the acceleration factor R is used to set and use the number of copies and/or amount of change. Where a machine-learned model is used, even with fixed rather than learned weights, the machine-learned model architecture (e.g., CNN) is established to accept a maximum number of channels (i.e., maximum number of copies or altered versions). The maximum corresponds to the highest possible or acceptable acceleration factor but may be a lesser value. Where the acceleration factor for a given patient is the maximum, then all the channels are used. Where the acceleration factor and corresponding number of images is less than the maximum, zero padding is used for excess channels (e.g., Rmax is 6, R being used is 4, so zero pad 2 channels). The architecture defines the channels. Unused channels are provided with zero values. For R<Rmax, extra channels can be defined with zero inputs. For better information flow, indicator functions associated with input channels signal an empty channel. In alternative embodiments, one or more of the altered images is applied to multiple of the available channels instead of zero padding. Any of the channels may be padded, such as the padding higher channels (e.g., channels 5 and 6 and not channels 1-4).

FIG. 4 shows an alternative approach for better handling of variable acceleration factors. A deepsets approach is used to process the differently shifted versions of the input image. The de-aliasing CNN 400 is restricted to a permutation invariant or equivariant functions with a particular structure and can be decomposed in the form of $\rho(\Sigma_{x \in X} \varphi(x))$, where $\varphi$ are the shared weights and p is the normalization as suitable transformations. The input set of shifted images is passed through deepsets blocks (e.g., blocks 1 and 2 of FIG. 4). Each block is composed of a CNN 400 applied for each shifted image independently followed by a normalization of the estimated outputs using a summation and convolutional layers 410. The CNNs 400 being independently applied allows for the CNNs 400 to match the number of altered images, avoiding zero padding. More interactions between different shifted images may be exploited through a deeper architecture that stacks several of those de-aliasing blocks (e.g., more than two). FIG. 4 shows a stack or sequence of two or more blocks. The input to the regularizer is the normalization of the images output by the CNNs 400 and sum and convolution 410 of the last block.

The de-aliasing CNN can be utilized within an unrolled deep learning (DL) framework for accelerated MRI in multiple ways. For example, the alteration stage replaces an algorithm-based initialization (e.g., zero-filled reconstruction is replaced by the output of the alteration stage), which can lead to faster convergence with fewer cascades (i.e., fewer iterations). The first regularizer in an unrolled iterative reconstruction is initialized by the alteration stage. Additionally, or alternatively, the proposed de-aliasing CNN is used in subsequent CNN-based regulation networks, whether in all cascades (iterations) or specified early cascades (to minimize any added computational overhead).

The regularizer outputs a regularized image in act 526. The image may have less aliasing artifact due to the alteration of the input to the regularizer. The last iteration in the reconstruciton, either with or without alteration and regularization, outputs an image. The output image has fewer aliasing artifacts due to use of alteration with the regularization in one or more iterations of the reconstruction. The alteration assists in reduction in aliasing artifact that is non-local.

Acts 522, 524, and 526 represent one embodiment of the reconstruction with the regularizer of act 520. In the reconstruction, a regularizer for at least one reconstruction iteration is implemented with an alteration of the input, such as by creating multiple shifted copies based on the acceleration factor. Additional, different, or fewer acts may be provided.

In act 530, a display (e.g., display screen) displays the medical image, such as the MR image. The medical image, after or as part of any post processing, is formatted for display on the display. The display presents the image for viewing by the user, radiologist, physician, clinician, and/or patient. The image assists in diagnosis.

The displayed image may represent a planar region or area in the patient. Alternatively, or additionally, the displayed image is a volume or surface rendering from voxels (three-dimensional distribution) to the two-dimensional display.

The same reconstruction and deep machine-learned model may be used for different patients. The same or different copies of the same reconstruction and machine-learned model are applied for different patients, resulting in reconstruction of patient-specific representations or reconstructions using the same values or weights of the learned parameters of the model. Different patients and/or the same patient at a different time may be scanned while the same or fixed trained machine-learned regularization model is used in reconstruction the image. The alteration adapts to the acceleration used. Alternatively, different alteration is used for different acceleration.

Although the subject matter has been described in terms of exemplary embodiments, it is not limited thereto. Rather, the appended claims should be construed broadly, to include other variants and embodiments, which can be made by those skilled in the art.

What is claimed is:

1. A method for reconstruction of a medical image in a medical imaging system, the method comprising:
   scanning, by the medical imaging system, a patient with an acceleration factor, the scanning resulting in measurements;
   reconstructing, iteratively by an image processor, the medical image from the measurements, the iterative reconstruction including at least a regularizer implemented with one or more machine-learned networks and an alteration stage, wherein for each iteration, the alteration stage generates multiple shifted copies of an input image by applying a circular shift to the input image, the input image provided by an initial image from the measurements or a previous iteration of the iterative reconstruction, wherein the multiple shifted copies of the input image are input to the one or more machine-learned networks implemented by the regularizer and wherein the regularizer is configured to output an output image that is input into a subsequent iteration, wherein the iterative reconstruction proceeds for a plurality of iterations; and
   displaying the reconstructed medical image.

2. The method of claim 1 wherein scanning comprises scanning with the medical imaging system being a magnetic resonance (MR) scanner and the measurements being k-space measurements, the scanning comprising parallel imaging combined with compressed sensing.

3. The method of claim 1 wherein reconstructing comprises reconstructing as an unrolled iterative reconstruction where each of multiple reconstructions in the unrolled iterative reconstruction includes regularization.

4. The method of claim 3 wherein reconstructing comprises generating the input as an initialization of the unrolled iterative reconstruction, the regularizer being a first of the multiple reconstructions.

5. The method of claim 1 wherein the alteration stage generates the multiple shifted copies of the input image using the circular shift from an output image of a data-consistency check.

6. The method of claim 1 wherein an amount of the multiple shifted copies substantially equals the acceleration factor.

7. The method of claim 6 wherein forming the multiple shifted copies comprises shifting the input image by different shifts, each of the shifts being a function of the acceleration factor where a number of the multiple shifted copies is provided as the input image and shifted images corresponding to the different shifts.

8. The method of claim 6 wherein forming the multiple shifted copies of the input image comprises shifting the input image by different shifts, the different shifts being fractions with the acceleration factor as a denominator.

9. The method of claim 8 wherein shifting comprises shifting with sequential integers as numerators of the fractions.

10. The method of claim 8 wherein shifting comprises shifting with a field of view of the regularizer multiplied by sequential integers as numerators of the fractions.

11. The method of claim 1 wherein reconstructing comprises inputting a concatenation of the multiple shifted copies of the input image as the input to the regularizer.

12. The method of claim 1 wherein reconstructing further comprises applying convolutional neural networks to the multiple shifted copies of the input image, respectively, the input to the regularizer being a normalization of the multiple shifted copies of the input image output by the convolutional neural networks.

13. The method of claim 12 wherein the normalization comprises a sum and convolution.

14. The method of claim 12 wherein applying the convolutional neural networks comprises applying, independently for each of the multiple shifted copies of the input image, the convolutional neural networks with shared weights.

15. The method of claim 1 wherein a maximum number of channels is provided, and wherein reconstructing comprises forming the multiple shifted copies of the input image where the number is less than the maximum number, wherein zero padding is used for excess ones of the channels.

16. A system for reconstruction in medical imaging, the system comprising:
a medical scanner configured to scan a region of a patient, the scan under sampling by a factor and providing scan data;
an image processor configured to reconstruct a representation of the region from the scan data, the image processor configured to iteratively reconstruct by application of a machine-learned model in a regularization stage, the regularization stage having an input provided by an alteration stage that generates a plurality of circular shifted copies of an input image; and
a display configured to display an image of the region from the reconstructed representation.

17. The system of claim 16 wherein the image processor is configured to reconstruct with an unrolled iterative reconstruction, the input to the regularization stage being an initialization of the unrolled iterative reconstruction.

18. The system of claim 16 wherein the image processor is configured to form the plurality of circular shifted copies by different amounts, the different amounts being different fractions with the factor in a denominator.

19. The system of claim 16 wherein the machine-learned model of the regularization stage comprises a convolutional neural network arranged to receive the input, the input comprising a concatenation of the plurality of circular shifted copies.

20. The system of claim 16 wherein the machine-learned model of the regularization stage comprises a plurality of convolutional neural networks with shared weights independently applied to the plurality of circular shifted copies and a sum and convolution network combining outputs of the convolutional neural networks.

21. A method for reconstruction of a medical image, the method comprising:
scanning, by a magnetic resonance imaging system, a patient using parallel imaging with compressed sensing having an acceleration factor, the scanning resulting in k-space data;
reconstructing, by an image processor, the medical image from the k-space data, the reconstruction comprising a data consistency stage and a regularization stage, an output image of the data consistency stage circularly shifted different amounts to form a plurality of different shifted images, the different amounts based on the acceleration factor, and wherein an input to the regularization stage comprises the plurality of different shifted images or a combination of the plurality of different shifted images; and
displaying the medical image.

* * * * *